March 27, 1962 H. E. VAUGHAN 3,027,548

ELECTROMAGNETIC COUPLING ARRANGEMENTS

Filed Dec. 17, 1956

INVENTOR
H. E. VAUGHAN
BY Kenneth B. Hamlin
ATTORNEY

3,027,548 ELECTROMAGNETIC COUPLING ARRANGEMENTS

Henry E. Vaughan, Chatham, N.J., assignor to Bell Telephone Laboratories, Incorporated, New York, N.Y., a corporation of New York Filed Dec. 17, 1956, Ser. No. 628,869
11 Claims. (Cl. 340—174)

This invention relates to electromagnetically coupled circuits and more particularly to an arrangement for providing interconnections between electrical conductors by electromagnetic coupling.

In present day information processing systems such as computers, telephone systems and the like, electromagnetic coupling has been advantageously utilized to provide desired interconnections between electrical conductors. For example, in translators or word generators, desired patterns of interconnections between pluralities of input and output conductors have been attained by employing a plurality of toroidal magnetic bodies to electromagnetically couple the input and output conductors in the desired patterns. One such translating arrangement is disclosed in Patent 2,657,272 of T. L. Dimond issued on October 27, 1953, where a plurality of toroidal magnetic bodies having windings connected to output conductors are placed in a substantially fixed physical relationship to form a matrix, and input conductors are selectively threaded through the toroids to provide a desired pattern of interconnection between input and output conductors. A current in one of the input conductors will induce current in the output conductors of the toroids through which the input conductor is threaded. In this manner a translation of a code represented by the input conductor to a different code represented by the combination of the output conductors may be accomplished. Although the electromagnetically coupled arrangement providing desired patterns of interconnections between electrical conductors utilized in the above-described translator and in other such electrical circuits known in the art has many advantages over previously known arrangements, it also has several inherent disadvantages.

In the fabrication of electromagnetically coupled circuits such as translators or word generators of the type disclosed in the above cited T. L. Dimond patent, the problem of threading the input and output conductors through the toroids is a difficult and costly one. Where a large matrix of toroids is utilized and where the patterns of interconnections between conductors is complex, considerable time and effort must be expended in the original fabrication of such circuits. This problem is further intensified where a plurality of conductors is threaded through each toroid and where the toroids are of small size. Because the fabrication of such circuits is of necessity a slow and laborious manual operation, the possibility of errors in the desired pattern of interconnections between conductors is increased.

Another disadvantage of the above-described electromagnetic coupling arrangement is that it is inherently inflexible. To change the pattern of interconnections between conductors requires the disconnection of one end of one conductor and its rethreading through the toroids in accordance with the new pattern. If the new path of the pattern is appreciably longer than the prior path the conductor must be completely removed and replaced by a new conductor. When circuits of this type are of considerable size the task of rearranging the pattern of interconnections between conductors is considerably more difficult and time-consuming and is also subject to error.

A still further disadvantage of the electromagnetic coupling arrangement described above results from unwanted electrical coupling between conductors. Because the conductors are threaded through the toroids in an indiscriminate manner and have no fixed physical relationship to each other, there is a possibility of undesired stray electrical coupling between conductors. Because of this, extreme care must be exercised by the person manually threading the conductors through the toroids to make certain that the conductors are properly placed so as to minimize a possibility of this unwanted coupling between conductors.

Accordingly it is an object of the present invention to provide interconnections between electrical conductors by an electromagnetic coupling arrangement wherein the aforementioned disadvantages are eliminated.

More specifically, it is an object of the present invention to provide an electromagnetic coupling arrangement which is more economical and reliable than prior arrangements.

It is also an object of the present invention to provide desired interconnections between electrical conductors by an electromagnetic coupling arrangement which can be readily rearranged to meet changing requirements.

Another object of the present invention is to provide desired interconnections between electrical conductors by an electromagnetic coupling arrangement wherein stray or unwanted electrical coupling between conductors is minimized.

The above and other objects of this invention are attained in one specific illustrative embodiment in which the input and output conductors of a circuit are placed in separate grids which intersect so that each input conductor crosses transverse to each output conductor. The conductors are imbedded in an insulating sheet and are thereby held rigidly apart from each other in a fixed physical relationship. The insulating sheet is provided with through holes which are located in pairs at the intersections of each input and output conductor. These holes are proportioned to receive a horseshoe shaped magnetic body which, when in position, straddles the intersection of an input and an output conductor. The insulating sheet, bearing the matrix of conductors and holes, is placed on a magnetic sheet which completes the magnetic path for each horseshoe element placed at an intersection. The horseshoe magnetic elements are readily movable and they afford a ready arrangement for effecting a new pattern of interconnection. The conductors are held apart in a fixed physical relationship by virtue of being imbedded in the insulating sheet and therefore the stray coupling between conductors is minimized.

In accordance with one feature of this invention, movable magnetic elements are arranged to permit rapid and facile changing of the pattern of inductive coupling between pluralities of conductors.

In accordance with another feature of this invention a single means, namely a ferrite sheet, is provided to complete low reluctance magnetic paths at selected intersections of conductors.

In accordance with still another feature of this invention, input and output conductors are arranged in a fixed physical relationship to minimize stray electrical coupling between conductors.

The invention and the above noted and other features thereof will be understood more clearly and fully from the following detailed description with reference to the accompanying drawing in which.

Figure 1:
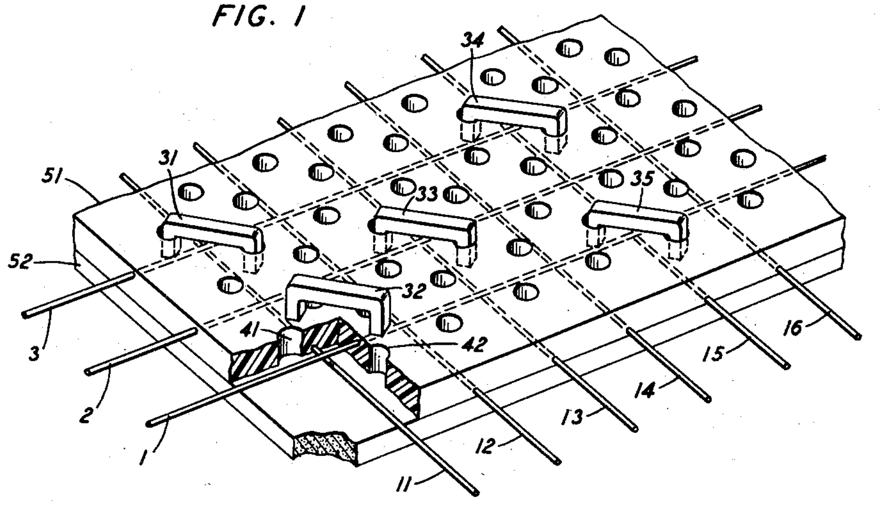
FIG. 1 is an illustrative embodiment of this invention.

In FIG. 1 the conductors 1 through 3 are representative of input conductors, and conductors 11 through 16 are representative of output conductors. The conductors are all imbedded in an insulating sheet 51 which holds the conductors apart and in a fixed physical relationship. The insulating sheet has a pair of through holes, such as 41 and 42, at each intersection of an input and an output conductor. These holes are proportioned to receive U-shaped magnetic elements such as 31 through 35, which, when in place in the holes, straddle the intersection of an input and an output conductor. A low reluctance magnetic path about each intersection at which a magnetic element is placed is completed by the ferrite sheet 52 upon which the insulating sheet 51 and the magnetic elements 31 through 35 rest. As the magnetic elements protrude, like handles, from the insulating sheet they are easily moved from intersection to intersection to effect a new pattern of interconnection.

By way of example, if a current pulse is applied to input conductor 1, output current pulses will be obtained on conductors 11 and 15 by virtue of the electromagnetic coupling provided by magnetic elements 32 and 35 in cooperation with the ferrite sheet 52.

It is obvious to one skilled in the art that the advantages of this invention can be realized in structures which differ in immateiral details from FIG. 1. For example, the grids of conductors need not be limited to two and they need not cross each other at right angles. Further, the output conductors need not be straight wires but could also be arranged to have a coil comprising a plurality of turns at each intersection and the coil could be arranged to encompass one leg of a magnetic element placed at an intersection. It is further obvious that the electromagnetic coupling arrangement of the present invention may advantageously be utilized to provide interconnections between electrical conductors which are not transverse but which extend in the same general direction and in the same or different planes.

Figure 2:
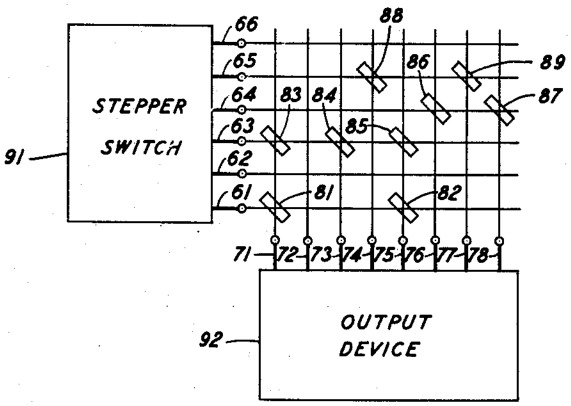
FIG. 2 is a matrix word generator in which the arrangements of this invention may be advantageously employed.

The electromagnetic coupling arrangement of the present invention may be advantageously employed to selectively couple pluralities of input and output conductors in any type of circuit which requires rapid and frequent changing of the pattern of interconnection between the conductors. For example, the arrangement in accordance with the present invention may be utilized to advantage in a translator of the type disclosed in the above cited T. L. Dimond patent. A further example of the manner in which the electro-magnetic coupling arrangement of the present invention may advantageously be utilized is illustrated in the matrix word generator shown in FIG. 2. Referring to FIG. 2, it will be observed that the matrix word generator comprises a stepper switch 91, a plurality of input conductors 61 through 66, a plurality of output conductors 71 through 78, and an output device 92. The input conductors and output conductors are held in a fixed physical relationship by being imbedded in a body of nonconductive material (not shown in FIG. 2) in accordance with this invention. The interconnections between input and output conductors in the matrix word generator are arranged in accordance with a predetermined pattern by the electromagnetic coupling arrangement of the present invention through the use of a plurality of magnetic elements 81 through 87 cooperating with the ferrite sheet. Current pulses are successively applied to input conductors 61 through 66 by stepper switch 91, and successive "words" represented by current pulses in predetermined ones of the output leads 71 through 78 are applied to output device 92. For example, a current pulse applied to input conductor 61 by stepper switch 91, will by virtue of the electromagnetic coupling provided by magnetic elements 81 and 82 associated with a ferrite sheet (not shown in FIG. 2), provide current pulses in output conductors 71 and 75 to output device 92. If it is desired to change the pattern of interconnection in the matrix word generator to generate different "words," it is merely necessary to remove magnetic elements 81 through 87 and rearrange them at desired intersections of conductors 61 through 66 and 71 through 78 in accordance with the new pattern.

It is to be understood that the above-described arrangements are illustrative of the application of the principles of the invention. Numerous other arrangements may be devised by those skilled in the art without departing from the spirit and scope of the invention.

What is claimed is:

1. An electromagnetic coupling arrangement for selectively providing current paths between pluralities of electrical conductors comprising in combination, a plurality of movable magnetic elements each adapted to partially circumscribe a plurality of conductors and partially provide a low reluctance magnetic path therearound, means holding each of said magnetic elements in a circumscribing relationship to selected ones of said plurality of electrical conductors, and means cooperating with all of said magnetic elements for completing a low reluctance magnetic path around the selected ones of said pluralities of electrical conductors partially circumscribed by each.

2. An electromagnetic coupling arrangement for selectively providing interconnections between a plurality of electrical conductors comprising in combination, means holding said conductors in a fixed physical relationship, a plurality of U-shaped movable magnetic elements each adapted to partially circumscribe selected ones of said conductors, means holding said magnetic elements in a circumscribing relationship to said selected ones of said conductors, and means cooperating with all of said magnetic elements for completing a low reluctance magnetic path around the selected ones of said conductors partially circumscribed by each.

3. The combination claimed in claim 2 wherein said means holding said conductors in a fixed physical relationship comprises an insulating body in which said conductors are imbedded.

4. The combination claimed in claim 3 wherein said means holding said magnetic elements comprising pairs of holes in said insulating body, each of said pairs of holes being adapted to receive one of said magnetic elements and hold said elements in a circumscribing relationship to selected ones of said conductors.

5. The combination defined in claim 4 wherein said means cooperating with all of said magnetic elements comprises a body of magnetic material for completing a low reluctance path around the selected ones of said conductors partially circumscribed by each of said magnetic elements.

6. An electromagnetic coupling arrangement for selectively providing interconnections between a first group of electrical conductors and a second group of electrical conductors comprising, in combination, a nonconductive body in which said groups of conductors are imbedded, said first group of conductors being transverse to said second group of conductors in said body, a plurality of removable ferromagnetic elements selectively disposed at predetermined intersections of said first group of conductors and said second group of conductors in said nonconductive body and means cooperating with all of said ferromagnetic elements for completing a low reluctance magnetic path around the selected intersections of said conductors of said first and said second groups.

7. An electromagnetic coupling arrangement for selectively providing interconnections between a first group of electrical conductors and a second group of electrical conductors comprising in combination, a nonconductive body in which said conductors are imbedded, said first group of conductors being substantially parallel in a first plane in said body, said second group of conductors being substantially parallel in a second plane in said body and transverse to said first group of conductors, a plurality of removable U-shaped ferromagnetic elements selectively disposed at predetermined intersections of said first group of conductors and said second group of conductors in said body to partially provide a low reluctance magnetic path encircling said conductors thereat, and means comprising a ferromagnetic body cooperating with all of said U-shaped ferromagnetic elements for completing the low reluctance magnetic path partially provided at each of said predetermined intersections by said elements.

8. An electromagnetic coupling arrangement for selectively providing interconnections between a first group of electrical conductors and a second group of electrical conductors comprising, in combination, a nonconductive body in which said conductors are imbedded, said first group of conductors being substantially parallel in a first plane in said body, said second group of conductors being substantially parallel in a second plane in said body and transverse to said first group of conductors, a plurality of U-shaped ferromagnetic elements each adapted to partially provide a low reluctance magnetic path encircling a conductor of said first group of conductors and a conductor of said second group of conductors at the intersection thereof in said body, said body having a plurality of pairs of through holes, one of said pairs of through holes being located at the intersection of each conductor of said first group of conductors with each conductor of said second group of conductors, each of said pairs of holes being adapted to receive one of said U-shaped ferromagnetic elements and in cooperation with said body to hold said element in a partial circumscribing relationship to the conductors of said first group of conductors and said second group of conductors thereat, and means comprising a ferromagnetic body cooperating with all of said U-shaped ferromagnetic elements located at predetermined intersections of said first group of conductors and said second group of conductors in said body for completing the low reluctance magnetic path partially provided thereat by said U-shaped ferromagnetic elements.

9. A magnetic storage device comprising, in combination, a data interrogation line, a data readout line intersecting said interrogation line, means forming a partial magnetic core around said intersection, means operable for completing said core and means for pulsing said interrogation line whereby said readout line is pulsed if said core is complete.

10. A magnetic storage system comprising, in combination, a matrix including a plurality of interrogation lines intersecting a plurality of readout lines, means forming partial magnetic cores around said intersections, manual means for completing said cores selectively in accordance with values assigned to said interrogation and said readout lines, and means for pulsing said interrogation lines in a predetermined order whereby said readout lines are pulsed in accordance with values set up with said manual means.

11. A magnetic storage device comprising, in combination, a matrix including a plurality of interrogation lines having denominational designations and intersecting a plurality of readout lines having digital designations, means forming partial magnetic cores around said intersections, manual means for completing said cores selectively in accordance with said digital and denominational designations, means for pulsing said interrogation lines successively by denominational orders whereby said digital readout lines are pulsed in accordance with a multidenominational number set up by said manual means.

References Cited in the file of this patent

UNITED STATES PATENTS

| | | |
|---|---|---|
| 233,968 | Bergmann | Nov. 2, 1880 |
| 252,395 | Odell | Jan. 17, 1882 |
| 2,064,771 | Vogt | Dec. 15, 1936 |
| 2,667,542 | Wright | Jan. 26, 1954 |
| 2,700,150 | Wales | Jan. 18, 1955 |
| 2,740,110 | Trimble | Mar. 27, 1956 |
| 2,776,411 | Anderson | Jan. 1, 1957 |
| 2,794,073 | Hoppe | May 28, 1957 |
| 2,825,891 | Duinker | Mar. 4, 1958 |
| 2,831,180 | Hasbrouck | Apr. 15, 1958 |